United States Patent
Dannels (10) Patent No.: US 7,622,922 B2
(45) Date of Patent: Nov. 24, 2009

(54) MAGNETIC RESONANCE IMAGING WITH SHORT ECHO TIMES

(75) Inventor: Wayne R. Dannels, Mentor, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 160 days.

(21) Appl. No.: 11/815,873

(22) PCT Filed: Feb. 7, 2006

(86) PCT No.: PCT/IB2006/050401

§ 371 (c)(1),
(2), (4) Date: Aug. 9, 2007

(87) PCT Pub. No.: WO2006/120584

PCT Pub. Date: Nov. 16, 2006

(65) Prior Publication Data

US 2008/0265885 A1      Oct. 30, 2008

Related U.S. Application Data

(60) Provisional application No. 60/652,087, filed on Feb. 11, 2005.

(51) Int. Cl.
*G01V 3/00*     (2006.01)
(52) U.S. Cl. ...................... 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 5,025,216 A | 6/1991 | Pauly et al. | |
| 5,150,053 A | 9/1992 | Pauly et al. | |
| 5,160,889 A | 11/1992 | Scheidegger et al. | |
| 5,250,898 A | 10/1993 | Hu et al. | |
| 5,510,710 A | 4/1996 | Nauerth | |
| 5,557,203 A | 9/1996 | Nauerth | |
| 6,400,151 B1 | 6/2002 | Haase et al. | |
| 6,486,670 B2 | 11/2002 | Heid | |
| 6,577,127 B2 * | 6/2003 | Harvey et al. | ................ 324/307 |
| 7,148,685 B2 * | 12/2006 | Block et al. | ................ 324/307 |
| 2002/0002331 A1 | 1/2002 | Cline et al. | |
| 2003/0191386 A1 | 10/2003 | Heid | |

(Continued)

FOREIGN PATENT DOCUMENTS

WO      2004095048 A1      11/2004

(Continued)

OTHER PUBLICATIONS

Brittain, et al., "Ultra-Short TE Imaging with Single-Digit (8us) TE," 11, 2004, Proc. Intl. Soc. Mag. Reson. Med., p. 629 Conf. Abstract.

(Continued)

*Primary Examiner*—Brij B Shrivastav (57) ABSTRACT

In a magnetic resonance imaging method, inner radial readout lines (100, 200, 300, 400) in an inner portion (102, 202, 302, 402) of k-space are acquired using a first readout magnetic field gradient profile (120, 220, 320, 420). Outer radial readout lines (104, 204, 304, 404) in an outer portion (106, 206, 306, 406) of k-space disposed substantially outside of the inner portion of k-space are acquired using a second readout magnetic field gradient profile (124, 224, 324, 424) different from the first readout magnetic field gradient profile. The acquired inner and outer radial readout lines are reconstructed to produce a reconstructed image.

22 Claims, 6 Drawing Sheets

U.S. PATENT DOCUMENTS

2004/0113614 A1 6/2004 Liang et al.
2005/0272997 A1* 12/2005 Grist et al. ................. 600/410
2008/0150531 A1* 6/2008 Hughes et al. ............. 324/309
2008/0262340 A1* 10/2008 Ham et al. ................. 600/415

OTHER PUBLICATIONS

Mir, et al., "Fast Three-Dimensional k-Space Trajectory Design Using Missile Guidance Ideas," 2004, Mag. Reson. Med., vol. 52, pp. 329-336. See Chapters Theory and Methods and Discussion.

Rahmer, et al., "3D Radial FID-Sampling for Ultrashort TE Imaging at 3 T," Proc. Intl. Soc. Mag. Reson. Med. 11, 2004, p. 2345, Conf. Abstract.

Wu, et al., "Density of Organic Matrix of Native Mineralized Bone Measured by Water—and Fat-Suppressed Proton Projection MRI," Mag. Reson. Med., 2003, vol. 50, pp. 59-68, on p. 61 Fig. 3 and p. 63, third and fourth paragraphs.

Hu, et al., "Pulsed Saturation Transfer Contrast," Mag. Reson. Med. 26, 231-240 (1992).

Irarrazabal, et al., "Fast Three Dimensional Magnetic Resonance Imaging," MRM 33, pp. 656-662 (1995).

Jackson, et al., "Twisting Radial Lines with Application to Robust Magnetic Resonance Imaging of Irregular Flow," Mag. Reson. Med. 25, 128-139 (1992).

Kuethe, et al., "Imaging Lungs Using Inert Fluorinated Gases," MRM 39, 85-88 (1998).

Lack, "Optimal Gradient Waveform Design for Projection Imaging and Projection Reconstruction Echo-Planar Imaging," Proc. of Soc. Mag. Reson. 3rd Scientific Meeting & European Soc. Mag. Reson. Med. & Biology 12th Annual Meeting & Exhibition, Nice, France Aug. 19-25, 1995, vol. 1.

Lauterbur, et al., "Theory and Simulation of NMR Spectroscopic Imaging and Field Plotting by Projection Reconstruction Involving an Intrinsic Frequency Dimension," J. Mag. Reson. 59, 536-541 (1984).

Eggers, et al., "Iterative ABo and T2 Correction for Radial Multi-Gradient-Echo Imaging," Kyoto ISMRM 2004.

Bergin, et al., "Lung Parenchyma: Projection Reconstruction MR Imaging," Radiology 1991: 179: 777-781.

Bernardo, et al., "Experimental Example of NMR Spectroscopic Imaging by Projection Reconstruction Involving an Intrinsic Frequency Dimension," J. Mag. Res. 61, 168-174 (1985).

Boada, et al., "Fast Three Dimensional Sodium Imaging," MRM 37:706-715 (1997).

Gewalt, et al., "MR Microscopy of the Rat Lung Using Projection Reconstruction".

Noll, et al., "A Homogeneity Correction Method for Magnetic Resonance Imaging with Time-Varying Gradients," IEEE Trans. on Med. Imaging, 10(4), Dec. 1991.

Boada, et al., "Constant Sampling Density Traversals for Faster Three Dimensional Sodium Imaging: A Theoretical Study," Proc. of SMR 2nd Meeting Aug. 6-12, 1994. San Francisco CA, vol. 1.

Noll, et al., "Deblurring for Non-2D Fourier Transform Magnetic Resonance Imaging," Mag. Reson. Med. 25, 319-333 (1992).

Parrish, et al., "Theoretical Basis for Sodium and Potassium MRI of the Human Heart at 1.5T," MRM 38: 653-661 (1997).

Pauley, et al., "A K-Space Analysis of Small-Tip-Angle Excitation," J. Mag. Reson. 81, 43-56 (1989).

Star-Lack, "Optimal Gradient Waveform Design for Projection Imaging and Projection Reconstruction Echoplanar Spectroscopic Imaging," Mag. Reson. Med. 41: 664-675 (1999).

Sutton, et al., "Fast, Iterative Image Reconstruction for MRI in the Presence of Field Inhomogeneities," IEEE Trans. on Medical Imaging, 22(2), Feb. 2003.

Sutton, et al., "Dynamic Field Map Estimation Using a Spiral-In/Spiral-Out Acquisition," Mag. Reson. in Med. 51: 1194-1204 (2004).

Reichert, et al., "Magnetic Resonance Imaging of Periosteum with Ultrashort TE Pulse Sequences," J. Mag. Reson. Imaging, 19:99-107 (2004).

Robson, et al., "Magnetic Resonance: An Introduction to Ultrashort TE (UTE) Imaging," J. Comput. Assist. Tomogr. 2003; 27(6).

Robson, et al., "Human Imaging of Phosphorous in Cortical and Travecular Bone in Vivo," Mag. Reson. Med. 51:888-892 (2004).

* cited by examiner

MAGNETIC RESONANCE IMAGING WITH SHORT ECHO TIMES

The following relates to the magnetic resonance arts. It finds particular application in magnetic resonance imaging of materials having short magnetic resonance decay times, such as lung tissue, atherosclerotic plaque, tendons, imaging of tissues infused with high concentrations of magnetic contrast agent, imaging of materials using nuclear magnetic resonances from atoms heavier than hydrogen, and so forth, and will be described with particular reference thereto. More generally, it finds application in magnetic resonance systems for imaging, spectroscopy, and so forth.

Short magnetic resonance decay times impose short echo times on the imaging sequence. When the decay time of the magnetic resonance (such as the T2 decay time or the T2* decay time) is comparable to a minimum echo time achievable by the magnetic resonance imaging scanner, imaging quality is generally compromised. The minimum echo time of the scanner is limited by a finite latency time between the end of the radio frequency excitation and the time when usable magnetic resonance sampling can begin. In some magnetic resonance imaging scanners, the latency time due to radio frequency recovery is about 100 microseconds. In two-dimensional imaging, the latency time between the transmit or excitation phase and the receive or readout phase can also include a ramp-down or refocusing delay imposed by removal of the slice-selective magnetic field gradient.

Radial sampling is advantageous for imaging using short echo times. Radial readout lines can be used to sample the central region of k-space that defines the low frequency reconstructed image structure first, followed by sampling of the higher frequency edges of k-space that contribute fine image details. Since the radial lines converge at k-space center, radial sampling also promotes adequate sampling of the central region of k-space. Sampling in the peripheral regions of k-space is relatively sparse. For imaging using short echo times, Pauly et al., U.S. Pat. No. 5,025,216, discloses using short shaped radio frequency pulses to reduce the latency time between the transmit and receive phases of the magnetic resonance imaging sequence. Still further improvement in imaging using short echo times can be achieved using three-dimensional imaging with non-selective RF excitation, which omits slice-selective magnetic field gradients.

The use of radial sampling in conjunction with such techniques improves image quality when imaging with short echo times. However, there remains a need in the art for further improvements in magnetic resonance imaging with short echo times.

The following contemplates improved apparatuses and methods that overcome the aforementioned limitations and others.

According to one aspect, a magnetic resonance imaging method is provided. Inner radial readout lines in an inner portion of k-space are acquired using a first readout magnetic field gradient profile. Outer radial readout lines in an outer portion of k-space disposed substantially outside of the inner portion of k-space are acquired using a second readout magnetic field gradient profile different from the first readout magnetic field gradient profile. The acquired inner and outer radial readout lines are reconstructed to produce a reconstructed image.

According to another aspect, a magnetic resonance imaging system is disclosed for performing a magnetic resonance imaging method in which inner radial readout lines in an inner portion of k-space are acquired using a first readout magnetic field gradient profile, outer radial readout lines in an outer portion of k-space disposed substantially outside of the inner portion of k-space are acquired using a second readout magnetic field gradient profile different from the first readout magnetic field gradient profile, and the acquired inner and outer radial readout lines are reconstructed to produce a reconstructed image.

One advantage resides in improved image quality using short echo times.

Another advantage resides in improved signal to noise ratio in radial sampling.

Another advantage resides in more uniform sampling of k-space using radial readout lines.

Another advantage resides in reduced image acquisition time.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

Figure 1:
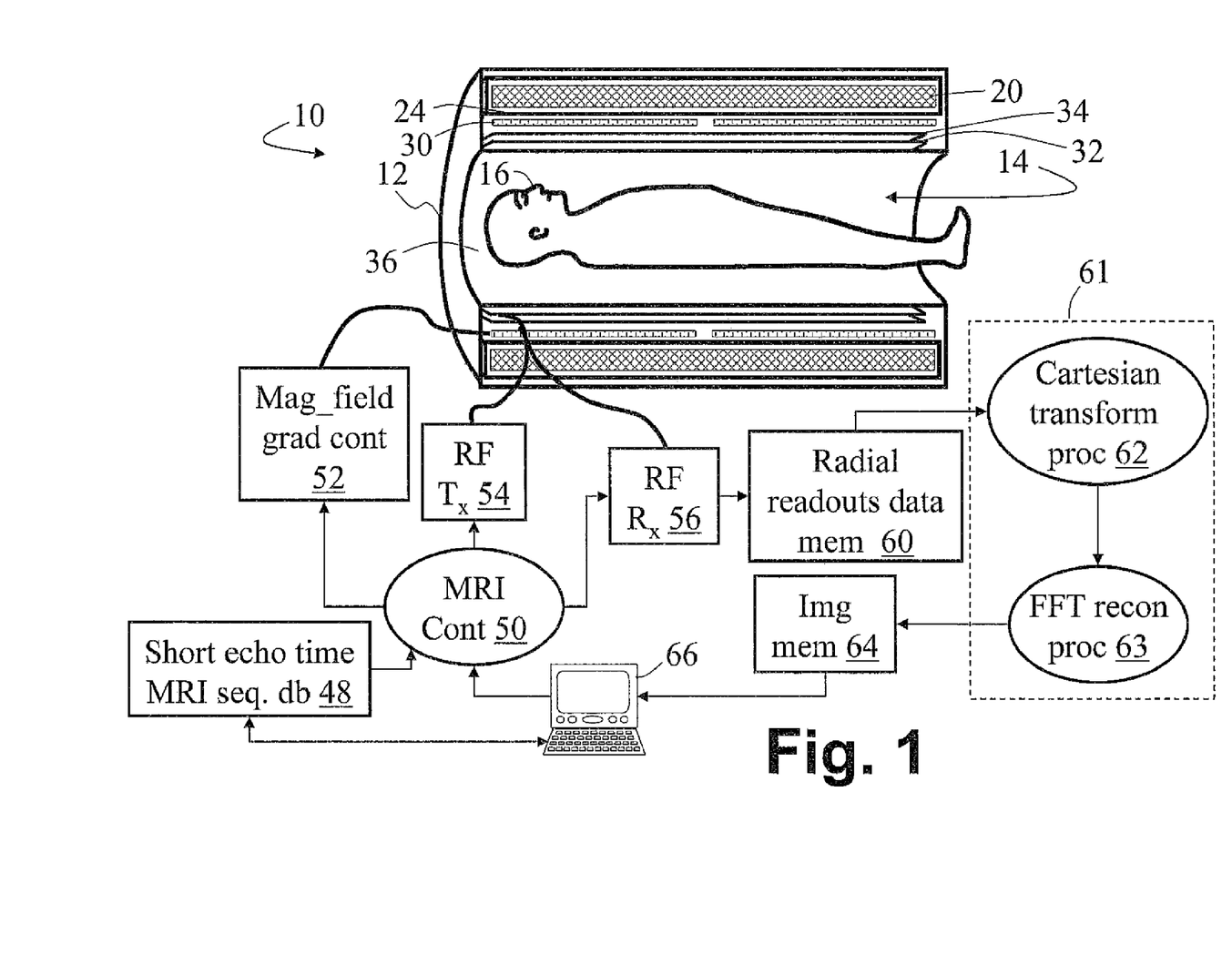
FIG. 1 diagrammatically shows a magnetic resonance imaging system employing a radio frequency coil.

With reference to FIG. 1, a magnetic resonance imaging scanner 10 includes a housing 12 defining an examination region 14 in which is disposed a patient or other imaging subject 16. A main magnet 20 disposed in the housing 12 generates a substantially spatially and temporally constant main magnetic field in the examination region 14. Typically, the main magnet 20 is a superconducting magnet surrounded by cryoshrouding 24; however, a resistive main magnet can also be used. Magnetic field gradient coils 30 are arranged in or on the housing 12 to superimpose selected magnetic field gradients on the main magnetic field within the examination region 14. Typically, the magnetic field gradient coils 30 include a plurality of coils for generating magnetic field gradients in a selected direction and at a selected gradient strength within the examination region 14. For example, the gradient coils 30 may include x-, y-, and z-gradient coils that cooperatively produce the selected magnetic field gradient in any selected direction. A whole-body radio frequency coil 32, such as a stripline coil disposed on an insulating dielectric former with a surrounding shield 34, a birdcage coil with rigid conductive rungs and rings, or so forth, is arranged in or on the housing 12 to inject radio frequency excitation pulses into the examination region 14 and to detect generated magnetic resonance signals. A bore liner 36 separates the coils from the examination region. Alternatively or additionally, one or more local coils (not shown) can be provided for excitation or receiving, such as a head coil, surface coil or coils array, or so forth.

A short echo time magnetic resonance imaging sequences database 48 stores radial readout sequences that are suitable for imaging with short echo times. A magnetic resonance imaging controller 50 executes a selected one of the short echo time magnetic resonance imaging sequences. The controller 50 operates magnetic field gradient controllers 52 coupled to the gradient coils 30 to superimpose selected magnetic field gradients on the main magnetic field in the examination region 14, and operates a radio frequency transmitter 54 coupled to the radio frequency coil 32 as shown, or to a local coil, surface coil, coils array, or so forth, to inject selected radio frequency excitation pulses at about the magnetic resonance frequency into the examination region 14. For two-dimensional imaging, the radio frequency excitation also includes a concurrent slice-selective magnetic field gradient imposed by the gradient system 30, 52.

The radio frequency excitation pulses excite magnetic resonance signals in the imaging subject 16 that are spatially radially encoded by applying a magnetic field gradient in a selected direction and with a selected gradient strength in accordance with the selected short echo time magnetic resonance imaging sequence. The imaging controller 50 operates a radio frequency receiver 56 connected with the radio frequency coil 32 as shown, or to a local coil, surface coil, coils array, or so forth, in accordance with the selected short echo time magnetic resonance imaging sequence to receive the radial readout magnetic resonance signals, and the received radial readout data are stored in a radial readouts data memory 60.

A reconstruction processor 61 includes a Cartesian coordinates transformation processor 62 that performs a radial-to-Cartesian coordinates conversion of the radial readouts data to produce data interpolated to a Cartesian grid. A fast Fourier transform processor 63 reconstructs the Cartesian gridded imaging data into a reconstructed image of the imaging subject 16 or a selected portion thereof lying within the examination region 14. Other reconstruction algorithms can be substituted for the reconstruction processor 61; for example, a filtered backprojection reconstruction process can be applied to the radial readouts to perform the image reconstruction.

The reconstructed image is stored in an images memory 64, and can be displayed on a user interface 66, transmitted over a local area network or the Internet, printed by a printer, or otherwise utilized. In the illustrated embodiment, the user interface 66 also enables a radiologist or other user to select the short echo time magnetic resonance imaging sequence from the database 48, and to interface with the imaging controller 50. In other embodiments, separate user interfaces are provided for operating the scanner 10 and for displaying or otherwise manipulating the reconstructed images.

The described magnetic resonance imaging system is an illustrative example. In general, substantially any magnetic resonance imaging scanner can perform the short echo time imaging sequences disclosed herein or their equivalents. For example, the scanner can include an open magnet, a vertical bore magnet, a low-field magnet, a high-field magnet, or so forth.

Figure 2A:
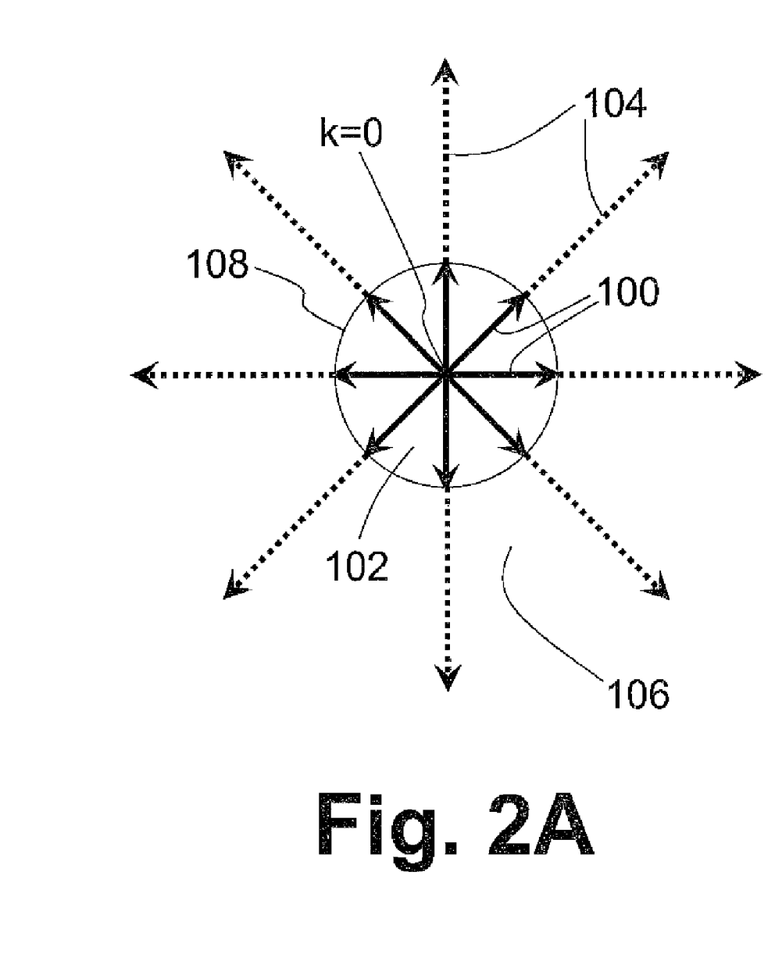
FIG. 2A diagrammatically shows trajectories of a plurality of inner and outer radial readout lines in k-space.
Figure 2B:
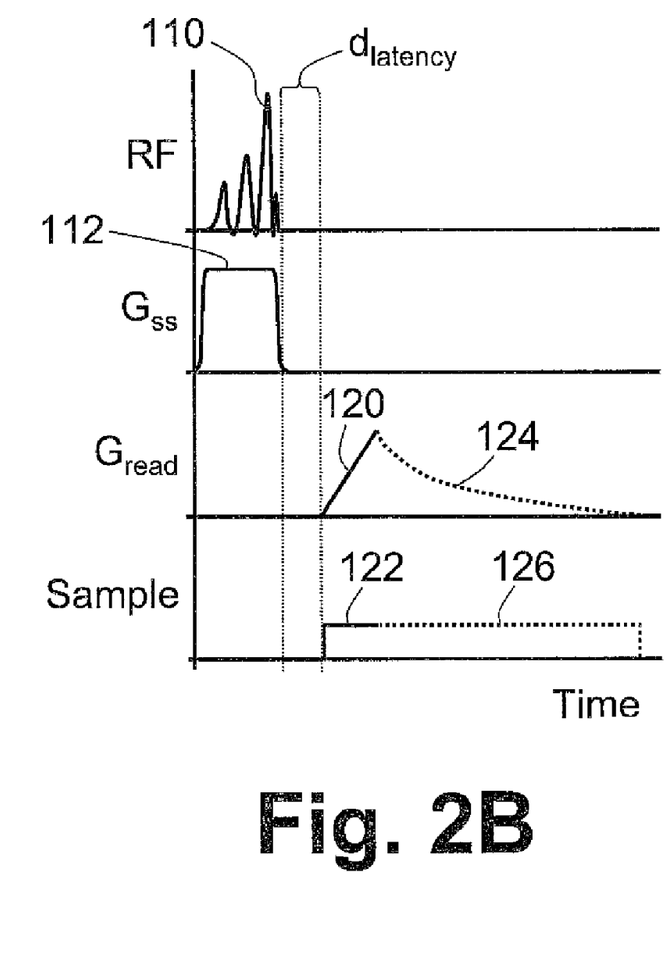
FIG. 2B diagrammatically shows a pulse sequence for acquiring the radial readout lines of FIG. 2A.

With reference to FIGS. 2A and 2B, an example short echo time magnetic resonance imaging sequence is described. FIG. 2A diagrammatically illustrates the trajectories of a plurality of radial readout lines in k-space. The radial readout lines include a plurality of inner radial readout lines 100 in an inner k-space portion 102 and a plurality of outer radial readout lines 104 in an outer k-space portion 106. Each inner radial readout line 100 starts at the k-space center and extends outward in a selected radial direction to a border 108 separating the inner and outer k-space regions 102, 106, and then continues in contiguous fashion as a corresponding one of the outer radial readout lines 104 following the same radial direction.

FIG. 2B diagrammatically illustrates a suitable pulse sequence for acquiring each corresponding pair of contiguous inner and outer radial readout lines 100, 104 in a selected radial direction. With reference to FIG. 2B and reference back to FIG. 1, a radio frequency excitation includes a radio frequency pulse 110 produced by the radio frequency transmitter 54 operating on the radio frequency coil 32, and an optional slice-selective magnetic field gradient pulse 112 produced by the magnetic field gradient controller 52 operating on one or more of the magnetic field gradient coils 30. The singular term "pulse" as used herein is to be broadly construed as encompassing a packet, plurality, or sequence of pulses that cooperatively define the radio frequency pulse 110, or the magnetic field gradient pulse 112. The excitation pulse as illustrated in FIG. 2B or subsequent FIGS. 3B, 4B and 5B may further be one element of a pair of excitations to generate data to be combined, with the other element of the pair not shown in the FIGURES. Typically, for two-dimensional imaging the slice-selective magnetic field gradient pulse 112 is applied to select the excited slice; on the other hand, for three-dimensional imaging the slice-selective magnetic field gradient pulse 112 is typically omitted so that a three-dimensional volume is excited. The radio frequency excitation is followed by a latency period $d_{latency}$ during which the hardware switches over from transmit mode to receive mode. The transmission of the radio frequency pulse 110 typically involves generating hundreds of volts on the radio frequency coil 32. The receiver radiofrequency circuitry 56 may have to be protected from such large voltages to avoid damage, and this voltage should be substantially removed before the magnetic resonance signal can be accurately received by the same coil or by a different radio frequency coil. During this latency period, it is typically necessary to electronically change the operating characteristics of one or more radiofrequency devices by charging capacitors or by biasing PIN diodes or the likes. The latency period $d_{latency}$ may also include a delay for removing or refocusing the optional slice-selective magnetic field gradient pulse 112. In the illustrated embodiment, the radio frequency pulse 110 is a short shaped radio frequency pulse for example as described in Pauly et al., U.S. Pat. No. 5,025,216, that reduces the radio frequency component of the latency time $d_{latency}$.

After the latency period $d_{latency}$, the readout phase begins. Both the inner radial readout line 100 and the corresponding outer radial readout line 104 having the same radial direction are read out responsive to the same radio frequency excitation. During readout of the inner radial readout line 100, a first readout magnetic field gradient profile 120 ramps up from zero, and sampling 122 is initiated. For illustrative clarity, these features of the pulse sequence are drawn using solid lines consistent with the solid lines used to illustrate the inner radial readout lines 100 in FIG. 2A. The direction of the radial readout line 100 is selected by the direction of the readout magnetic field gradient of the first readout magnetic field gradient profile 120. Acquisition of the corresponding outer radial readout line 104 follows immediately and contiguously upon completion of acquisition of the inner radial readout 100. The acquisition of the outer radial readout line 104 uses a second readout magnetic field gradient profile 124 that is decaying in gradient strength. Sampling 126 continues during acquisition of the outer radial readout line 104. For illustrative clarity, these features of the pulse sequence are drawn using dotted lines consistent with the dotted lines used to illustrate the outer radial readout lines 104 in FIG. 2A.

The second radial readout magnetic field gradient profile 124 has a non-uniform shape that is selected to provide relatively uniform sampling throughout k-space, and to increase signal-to-noise ratio. In general, the relationship between the k-space trajectory, $k_{read}(t)$, and the readout magnetic field gradient, $G_{read}(t)$, is given by:

$$k_{read}(t) = \gamma \int G_{read}(t) \cdot dt \qquad (1),$$

where in Equation (1) $\gamma$ is the gyromagnetic ratio. The k-space trajectory speed, $dk/dt$, is then given by:

$$\frac{dk}{dt} = \gamma \cdot G_{read}. \qquad (2)$$

Thus, the k-space trajectory speed is proportional to the strength of the readout magnetic field gradient. Moreover, for a constant sampling rate, a higher k-space trajectory speed corresponds to more sparse sampling in k-space, while a lower k-space trajectory speed corresponds to more dense sampling in k-space.

The first readout magnetic field gradient profile 120 ramps up rapidly so as to sample the inner k-space region 102 as rapidly as possible. Adequate density of sampling in the inner k-space region 102 is provided due to the convergence of all of the inner radial readout lines 100 at k-space center (labeled "k=0" in FIG. 2A). In some embodiments, the first readout magnetic field gradient profile 120 ramps up linearly at the slew rate of the magnetic field gradient system 30, 52.

In the outer k-space region 106, the k-space sampling by the outer radial readout lines 104 uses a gradually decreasing readout magnetic field gradient strength indicated by the decaying second readout magnetic field gradient profile 124. This produces a gradual slowing of the speed of the k-space trajectory leading to increasingly more dense k-space sampling as the outer radial readout line 104 moves away from k-space center. The decreasing magnetic field gradient strength is selected such that the noise variance proportional to the instantaneous bandwidth at a given location in k-space substantially cancels the radial weighting associated with the factor 1/r in two-dimensional scans, or the factor $1/r^2$ in three-dimensional scans.

The radial geometry in k-space has an intrinsic density of samples. In the three-dimensional (spherical polar) case this has the form $(1/r^2)$, which can be seen as the Jacobian associated with the change of coordinates when converting between Cartesian and spherical coordinate systems. The density of samples in turn is associated with a local noise averaging or reduction, where the noise variance approximately corresponds with the inverse of the sampling density, and the typical noise magnitude dependence corresponds to the square root, that is, "r" for the three-dimensional case. To achieve uniform sampling in Cartesian coordinates, the speed of the radial trajectories is chosen to make substantially uniform noise per unit volume in k-space. For three-dimensional imaging, this corresponds to setting the second magnetic field gradient profile 124 to:

$$G_{read}(t) \propto (t-t_o)^{-2/3} \qquad (3),$$

where $t_o$ is the time of the beginning of the second magnetic field gradient profile 124. Inserting this into Equation (1) yields the k-space trajectory:

$$k_{read}(t) \propto (t-t_o))^{1/3} \qquad (4).$$

For the two-dimensional case, the radial geometry in k-space has an intrinsic density of samples of (1/r), and a corresponding analysis yields the second magnetic field gradient profile 124 for the two-dimensional case:

$$G_{read}(t) \propto (t-t_o)^{-1/2} \qquad (5),$$

and the k-space trajectory for the two-dimensional case:

$$k_{read}(t) \propto (t-t_o)^{1/2} \qquad (6).$$

More generally, the second magnetic field gradient profile 124 has the shape:

$$G_{read}(t) \propto (t-t_o)^D \qquad (7),$$

where D is the called herein the gradient decay power. D=−⅔ for the three-dimensional case of Equation (3), and D=−½ for the two-dimensional case of Equation (5). A decaying second magnetic field gradient profile 124 is provided for values of the gradient decay power D lying between 0 and −1. The amount of signal-to-noise ratio improvement is relatively insensitive to the exact value of the gradient decay power D in the vicinity of the signal-to-noise ratio maximum. Moreover, other considerations such as reducing the image acquisition time, hardware limitations on gradient slew rate or peak gradient strength, and so forth, may motivate selection of gradient decay power values other than those of Equations (3) and (5). For example, it may be advantageous to select a gradient decay power that happens to be favorable in terms of eddy currents, vibrational mechanical modes, discharge of resonant electrical or electromagnetic circuits, or so forth. Still further, while a decaying power function form for the second magnetic field gradient profile 124 is illustrated and discussed, other monotonically decreasing profiles that substantially reduce the signal-to-noise ratio of the readout can be used as well.

Figure 3A:
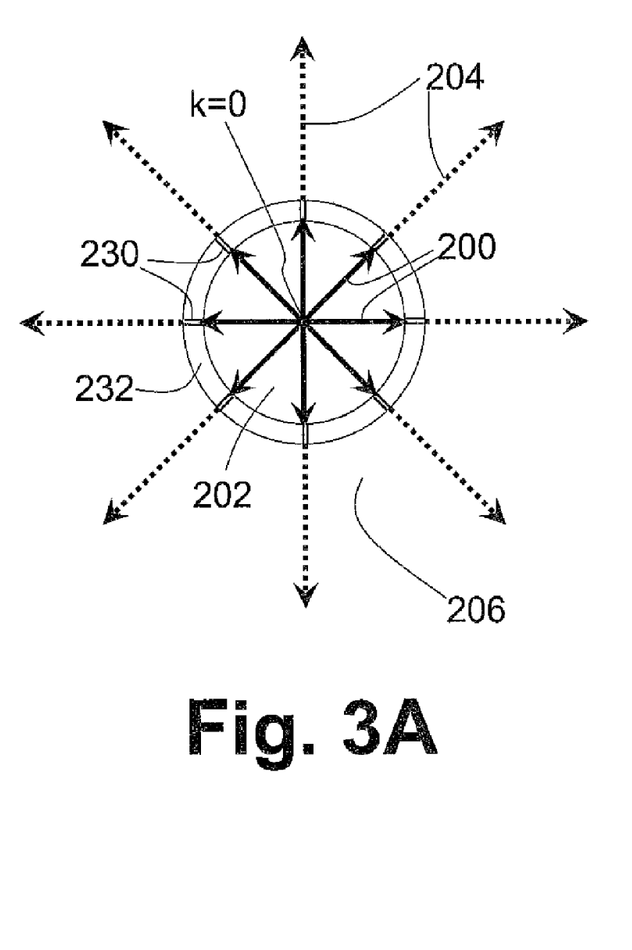
FIG. 3A diagrammatically shows trajectories of a plurality of inner, middle, and outer radial readout lines in k-space.
Figure 3B:
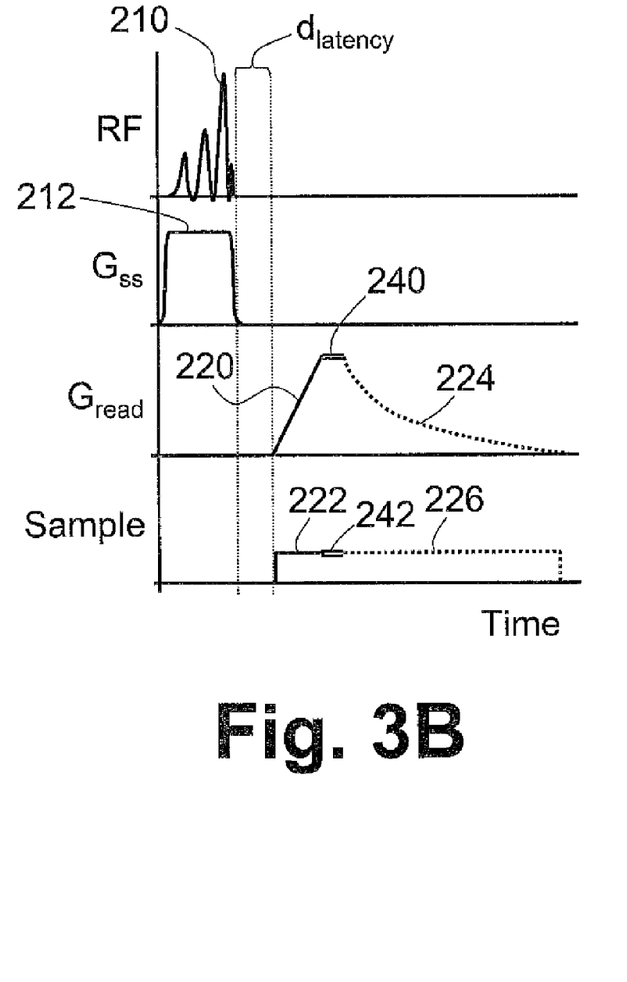
FIG. 3B diagrammatically shows a pulse sequence for acquiring the radial readout lines of FIG. 3A, where a portion of the readout magnetic field gradient profile is peak-limited.

With reference to FIGS. 3A and 3B, another example short echo time magnetic resonance imaging sequence is described. This sequence is similar to that illustrated in FIGS. 2A and 2B, and includes a plurality of inner radial readout lines 200 in an inner k-space portion 202 and a plurality of outer radial readout lines 204 in an outer k-space portion 206. Each inner radial readout line 200 starts at k-space center (k=0) and extends outward, followed by one of the outer radial readout lines 204 following the same radial direction. A radio frequency excitation including a radio frequency pulse 210 and an optional slice-selective magnetic field gradient pulse 212 is followed by the latency period $d_{latency}$, during which the hardware switches over from transmit mode to receive mode. After the latency period $d_{latency}$, a first readout magnetic field gradient profile 220 ramps up from zero, and sampling 222 is initiated, so as to acquire the inner radial readout line 200. Optionally, the first readout magnetic field gradient profile 220 may ramp up at the maximal slew rate of the gradient system 30, 52. Acquisition of the corresponding outer radial readout line 204 follows using a second readout magnetic field gradient profile 224 that is decaying in gradient strength. Sampling 226 occurs during acquisition of the outer radial readout line 204.

However, the imaging sequence of FIGS. 3A and 3B differs from that of FIGS. 2A and 2B in that acquisition of the outer radial readout line 204 does not immediately follow acquisition of the corresponding inner radial readout line 200. This is because the ramping first readout magnetic field gradient profile 220 becomes peak limited by limitations of the gradient system 30, 52. Accordingly, a middle radial readout line 230 is interposed between each corresponding pair of inner and outer radial readout lines 200, 204 and is directed in the same selected radial direction. The middle radial readout lines 230 acquire k-space samples in an annular k-space portion 232 disposed between the inner and outer k-space portions 202, 206. As seen in FIG. 3B, acquisition of the middle radial readout line 230 employs a third readout magnetic field gradient profile 240 that follows contiguously after the first readout magnetic field gradient profile 220 and has a constant magnetic field gradient strength that is peak-limited by the magnetic field gradient system 30, 52. During the third readout magnetic field gradient profile 240, sampling 242 continues. For illustrative clarity, these features of the pulse sequence are drawn using doubled lines consistent with the doubled lines used to illustrate the middle radial readout lines 230 in FIG. 3A. The second readout magnetic field gradient profile 224 continues immediately and contiguously after the end of the third readout magnetic field gradient profile 240.

Figure 4A:
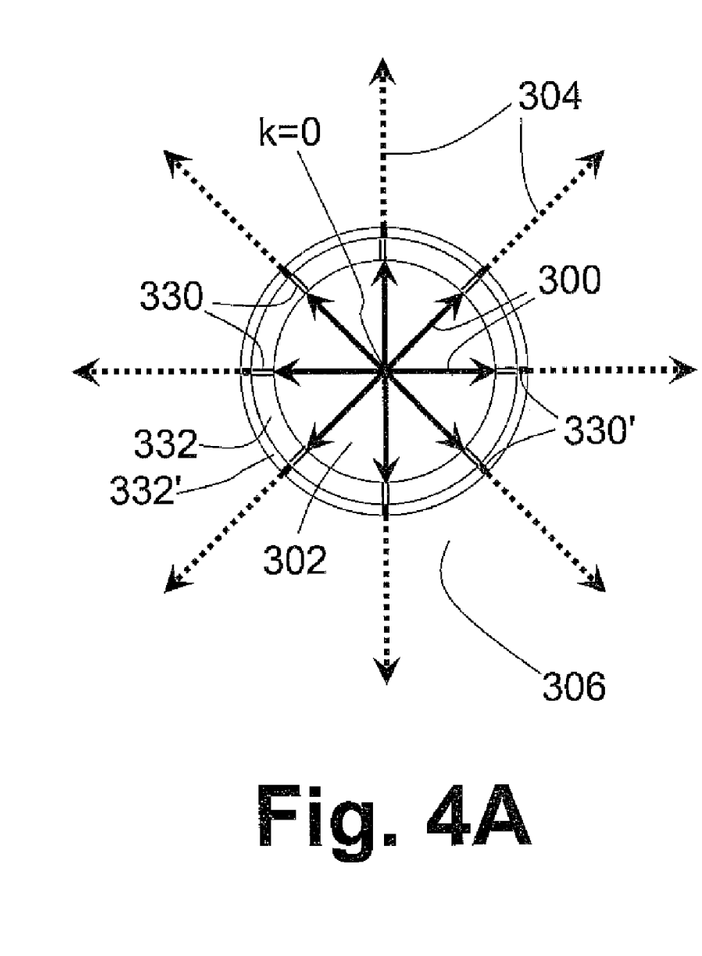
FIG. 4A diagrammatically shows trajectories of another plurality of inner, middle, and outer radial readout lines in k-space.
Figure 4B:
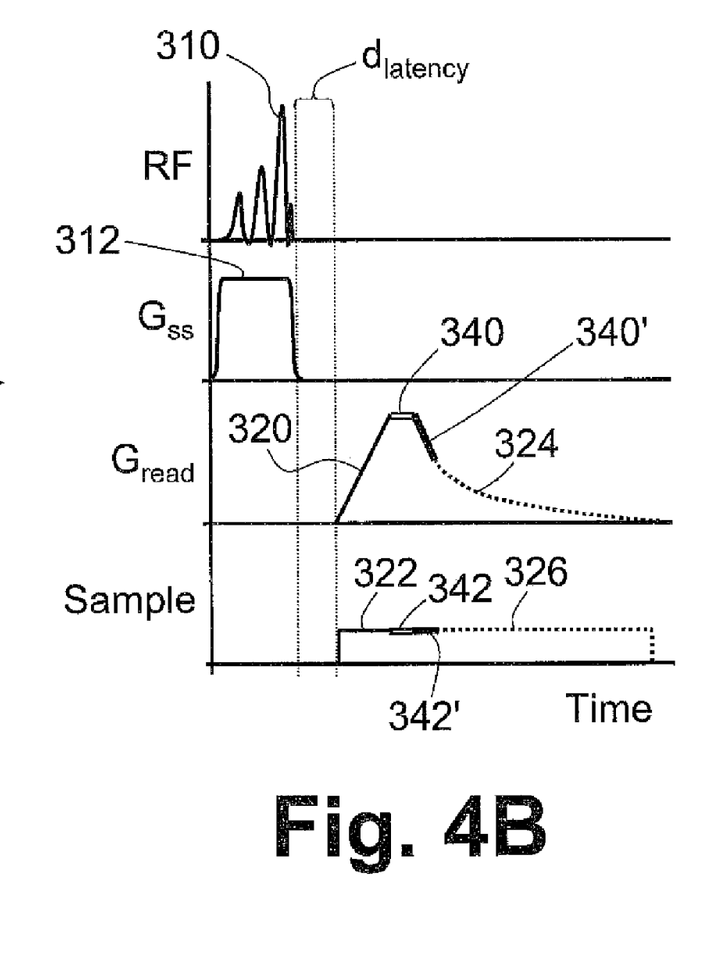
FIG. 4B diagrammatically shows a pulse sequence for acquiring the radial readout lines of FIG. 4A, where a portion of the readout magnetic field gradient profile is peak-limited and a portion of the readout magnetic field gradient profile is slew rate-limited.

With reference to FIGS. 4A and 4B, another example short echo time magnetic resonance imaging sequence is described. This sequence is similar to that illustrated in FIGS. 3A and 3B, and includes a plurality of inner radial readout lines 300 in an inner k-space portion 302, a plurality of middle radial readout lines 330 in an annular k-space portion 332, and a plurality of outer radial readout lines 304 in an outer k-space portion 306. Additionally, another plurality of middle radial readout lines 330' samples another annular k-space portion 332' interposed between the annular k-space portion 332 and the outer k-space portion 306. Each inner radial readout line 300 starts at k-space center and extends outward, and then continues in contiguous fashion as a corresponding one of the first middle radial readout lines 330 following the same radial direction, then continues in contiguous fashion as a corresponding one of the second middle radial readout lines 330' following the same radial direction, and then continues in contiguous fashion as a corresponding one of the outer radial readout lines 304 following the same radial direction.

FIG. 4B shows the corresponding pulse sequence. A radio frequency excitation including a radio frequency pulse 310 and an optional slice-selective magnetic field gradient pulse 312 is followed by the latency period $d_{latency}$ during which the hardware switches over from transmit mode to receive mode. After the latency period $d_{latency}$, a first readout magnetic field gradient profile 320 ramps up from zero, and sampling 322 is initiated, so as to acquire the inner radial readout line 300. Optionally, the first readout magnetic field gradient profile 320 may be slew-limited by the gradient system 30, 52. When the first readout magnetic field gradient profile 320 reaches the peak gradient strength that can be generated, a first middle readout magnetic field gradient profile 340 follows along with sampling 342. The first middle readout magnetic field gradient profile 340 has a constant magnetic field gradient strength that is peak-limited by the gradient system 30, 52.

The first middle readout magnetic field gradient profile 340 is followed by a decaying magnetic field gradient profile. However, in the pulse sequence of FIGS. 4A and 4B, the decaying profile called for by optimization of signal-to-noise ratio (for example, as given by Equations (3), (5), or (7)) would require an initial rate of decrease in the magnetic field gradient strength that is larger than the slew rate of the magnetic field gradient system 30, 52. Accordingly, the second middle radial readout line 330' is acquired using a second middle readout magnetic field gradient profile 340' and sampling 342' that follows immediately and contiguously from the first middle readout magnetic field gradient profile 340. For illustrative clarity, these features of the pulse sequence are drawn using thick solid lines consistent with the thick solid lines used to illustrate the second middle radial readout lines 330' in FIG. 4A. The second middle readout magnetic field gradient profile 340' has a magnetic field gradient that decreases in strength at the slew rate of the magnetic field gradient system 30, 52. The second middle readout magnetic field gradient profile 340' extends until the rate of decay of the magnetic field gradient strength called for by optimization of signal-to-noise ratio (for example, as given by Equations (3), (5), or (7)) decreases below the slew rate of the gradient system 30, 52. At that point, acquisition of the outer radial readout line 304 begins using a decaying readout magnetic field gradient profile 324 and corresponding sampling 326.

Optionally, an additional magnetic field gradient (not shown) may be applied after sampling to dephase or spoil undesired signal coherencies, or to refocus a steady state signal. Such additional gradients may be useful for controlling undesired artifacts originating from longer T2 substances in the same volume. Methods such as balanced FFE (Fast Field Echo) for radial trajectories, for example, can employ such additional gradients.

The magnetic resonance signal for the image extends across a bandwidth which the product of three factors: the gradient strength, the Larmor constant and the spatial extent of the image. Frequencies from outside of that signal band contain only noise, and should be excluded from appearing in the final image. This is done by some combination of frequency filtering and reconstruction. It is common practice to apply analog filters to demodulated receive signals which cut out frequencies roughly twice those of the desired imaging signal bandwidth. It is also common practice to sample at a sampling rate significantly higher than the Nyquist sampling rate associated with the desired imaging bandwidth, and subsequently apply digital filtering to cut out frequencies of roughly twice the desired final bandwidth.

In the embodiments described above, it is noted that the gradient strength may vary significantly, perhaps by factors much larger than two. For this method, since readout gradients incorporating a range of amplitudes are applied during data acquisition, care should be taken that adequate filtering is performed to avoid significant aliasing of noise from outside the signal bandwidth into the final image. Optionally, when applying time-varying readout gradients for sampling the data, the method can include a process of time-varying filtering. Such filtering can be performed as a digital process applied early in the reconstruction process. In one specific embodiment, each readout data line can be subdivided into segments, each segment may be classified as containing a range of instantaneous signal bandwidths based upon the range of instantaneous gradient strengths, and each segment filtered with a digital filter such that noise is rejected for all frequencies exceeding three times the instantaneous signal bandwidth but signal from within the instantaneous signal bandwidth is passed faithfully. In such an embodiment, the segments of the readout line should be chosen such that the instantaneous bandwidths within a segment vary by a factor somewhat less than three, so that a single digital filter can be applied to all the data within that segment. The reconstruction steps such as Fourier transforms subsequent to the filtering can then reject the remaining noise frequency bands lying within a factor of three of the signal bandwidth. Other techniques to reduce image degradation by aliased noise can readily be generated.

Figure 5A:
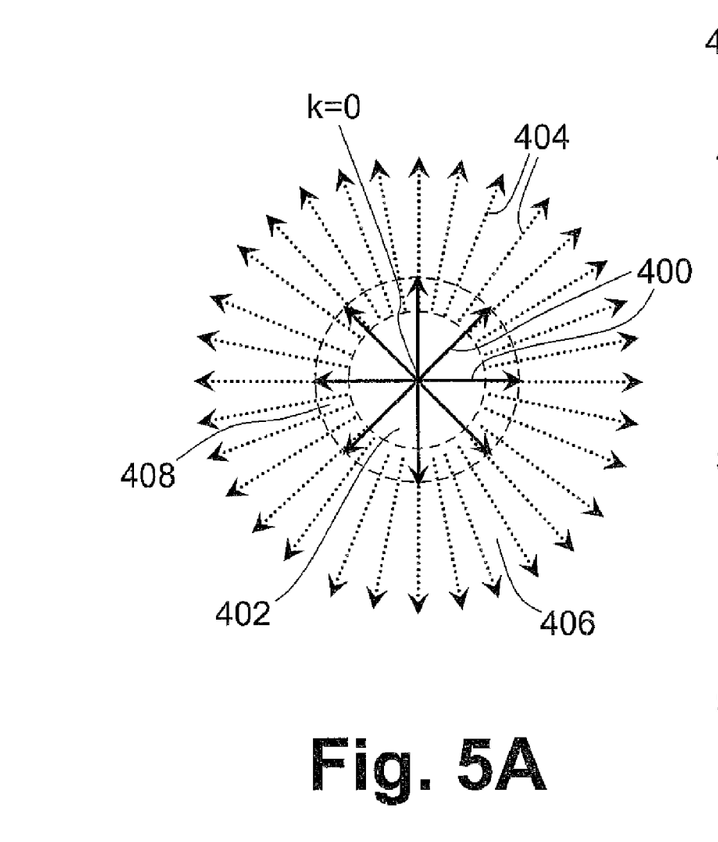
FIG. 5A diagrammatically shows trajectories of another plurality of inner and outer radial readout lines in k-space, in which the inner radial readout lines are acquired separately from the outer radial readout lines.
Figure 5B:
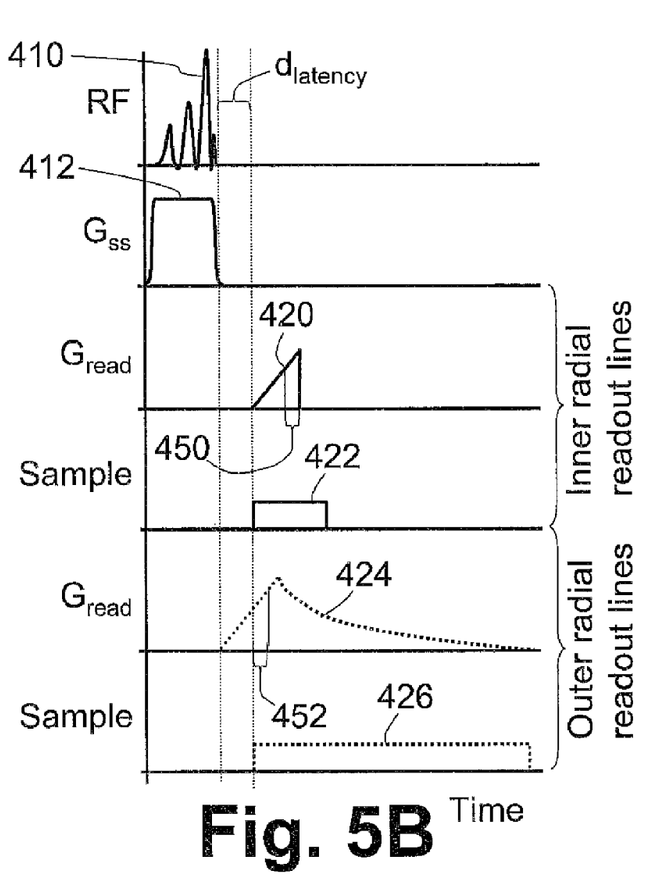
FIG. 5B diagrammatically shows a pulse sequence for acquiring the radial readout lines of FIG. 5A.

With reference to FIGS. 5A and 5B, another example short echo time magnetic resonance imaging sequence is described. Here, the inner radial readout lines 400 in inner k-space portion 402 are acquired responsive to different radio frequency excitations than outer radial readout lines 404 in outer k-space portion 406. This arrangement provides certain flexibilities in designing the data acquisition. For example, the inner and outer k-space portions 402, 406 optionally overlap in an overlap region 408. The inner and outer radial readout lines 400, 404 provide redundant sampling in the overlap region 408 that can be used for smoothing the transition. Moreover, the number of inner radial readout lines 400 can be different from the number of outer radial readout lines 404. Because sampling density in the inner k-space portion 402 is inherently high due to convergence of the inner radial readout lines 400 at k-space center, it is typically advantageous to have a substantially larger number of outer radial readout lines 404 as compared with the number of inner radial readout lines 400. In some embodiments, the number of outer radial readout lines 404 is at least five times greater than the number of inner radial readout lines 400.

With reference to FIG. 5B, each of the inner and outer radial readout lines 400, 404 is acquired as follows. A radio frequency excitation includes a radio frequency excitation pulse 410 and optional slice selective magnetic field gradient pulse 412. In the case of acquisition of one of the inner radial readout lines 400, the radio frequency excitation is followed by the latency period $d_{latency}$ during which the readout gradient is not applied. After the latency period $d_{latency}$, an inner or first readout magnetic field gradient profile 420 is applied in conjunction with sampling 422. The inner readout magnetic field gradient profile 420 is a linear ramp, optionally increasing at the slew rate of the gradient system 30, 52. The gradient profile 420 optionally includes a plateau or ramp-down portion (not illustrated) corresponding to the overlap region 408. Unlike previously described pulse sequences, the inner readout magnetic field gradient profile 420 is not followed by acquisition of one of the outer radial readout lines.

Rather, acquisition of each outer radial readout line 404 is performed responsive to a separate radio frequency excitation. In the embodiment illustrated in FIG. 5B, the radio frequency excitation for acquisition of the outer radial readout line 404 is followed by an outer or second readout magnetic field gradient profile 424 that begins to ramp up the magnetic field gradient strength during the latency period $d_{latency}$. It is understood that usable k-space sampling generally cannot be performed during the latency period $d_{latency}$; however, by ramping up the magnetic field gradient strength during the latency period $d_{latency}$, sampling 426 begins with the magnetic field gradient strength already at a high value. In accordance with Equation (1), the effect of ramping up during the latency period $d_{latency}$ is to move the start of the usable k-space trajectory away from k-space center so that as soon as usable sampling becomes feasible (that is, immediately after the latency period $d_{latency}$) acquisition of the outer radial readout line 404 can begin.

The optional overlapping k-space region 408 that is sampled by both the inner and outer radial readout lines 400, 404 corresponds to a portion 450 of the inner readout magnetic field gradient profile 420 and a portion 452 of the outer readout magnetic field gradient profile 424. The portions 450, 452 sample the same k-space region 408 and thus provide redundant data that can be used to smooth the transition. In some other embodiments, no such overlap is provided; rather, the ramping of the magnetic field gradient during the latency period $d_{latency}$ is sufficient to move the k-space trajectory to the very edge of the inner k-space region 402 before beginning usable sampling of the outer k-space trajectory 404.

Because acquisition of the inner and outer radial readout lines of the example pulse sequence of FIGS. 5A and 5B employ separate radio frequency excitations, the order of acquisition can be varied. For example, in some embodiments all the inner radial readout lines 400 are acquired first, followed by all the outer radial readout lines 404. Alternatively, acquisition of the inner and outer radial readout lines can be interleaved, for example alternating between acquiring an inner radial readout line, an outer radial readout line, an inner radial readout line, and so forth. As noted previously, the number of inner radial readout lines 400 can be different from the number of outer radial readout lines 404. Moreover, no correspondence is imposed between the radial directions of the inner and outer radial readout lines 400, 404. For example, the set of radial directions acquired by the inner radial readout lines 400 can be partially or completely different from the set of radial directions acquired by the outer radial readout lines 404.

The short echo time magnetic resonance imaging sequences of FIGS. 2A and 2B, 3A and 3B, 4A and 4B, or 5A and 5B, can be used for either two-dimensional imaging or three-dimensional imaging. In the example imaging sequences of FIGS. 2A and 2B, 3A and 3B, and 4A and 4B, acquisition of corresponding inner and outer radial readout lines responsive to the same radio frequency excitation implies that the same excitation geometry (two-dimensional or three-dimensional) be used for both the inner and outer readout lines. In contrast, since acquisition of the inner and outer radial readout lines of the example pulse sequence of FIGS. 5A and 5B use different radio frequency excitations, it is contemplated to acquire one set of radial readout lines using a three-dimensional excitation geometry, and the other set of radial readout lines using a two-dimensional excitation geometry.

Figure 6:
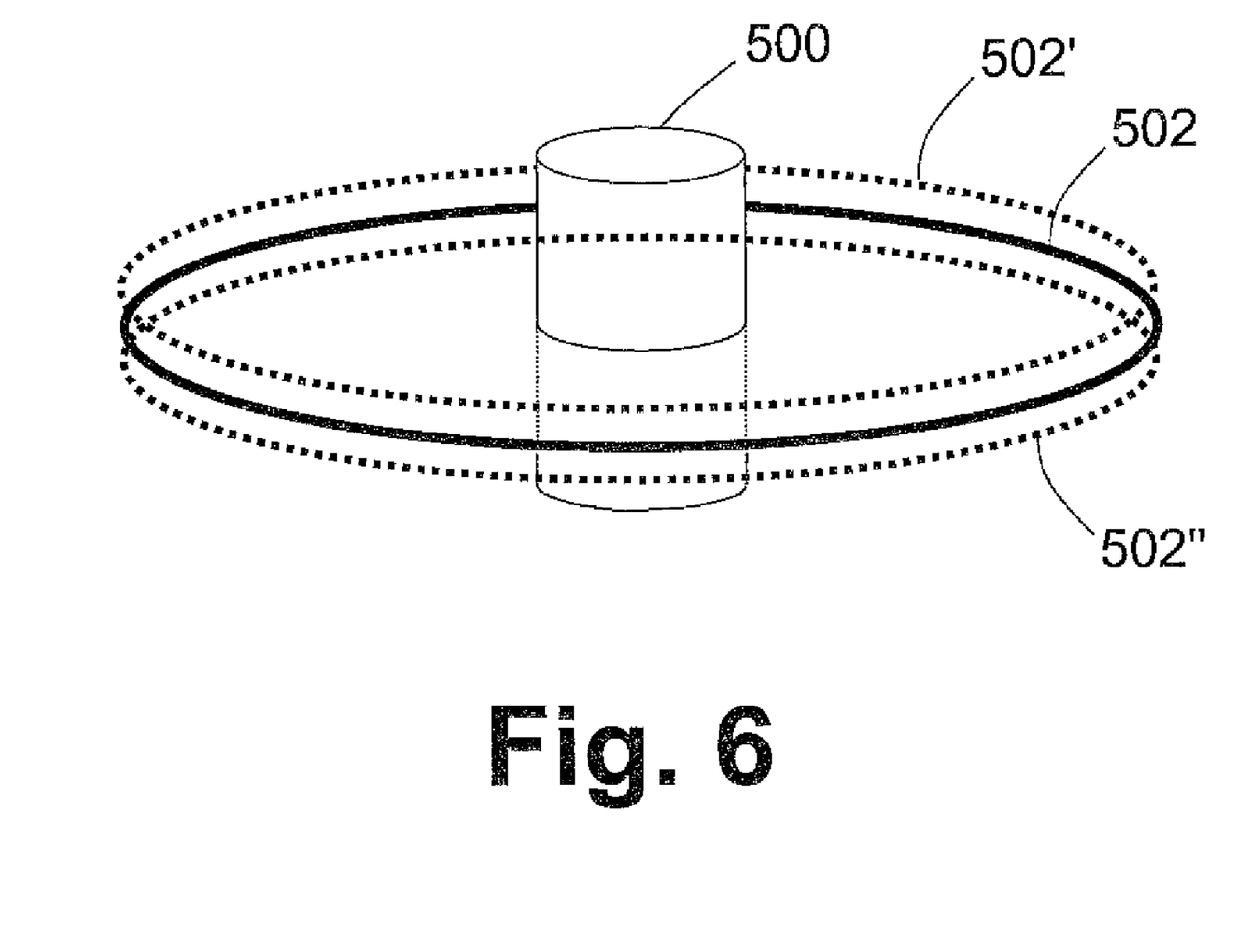
FIG. 6 diagrammatically shows inner and outer k-space portions where the inner k-space portion is three-dimensional and the outer k-space portion is two-dimensional.

With reference to FIG. 6 and continuing reference to FIGS. 5A and 5B, in one such approach, a three-dimensional volume 500 is acquired using the inner radial readout lines 400 with the slice-selective magnetic field gradient 412 omitted from the radio frequency excitations, while a two-dimensional slice 502 is acquired using the outer radial readout lines 404 with the slice-selective magnetic field gradient 412 included in the radio frequency excitations. Because the three-dimensional k-space sampling density decreases as $(1/r^2)$ for three-dimensional imaging, a relatively small number of inner radial readout lines 400 can sample the small three-dimensional inner k-space volume 500, whereas a much larger number of radial readout lines would be needed to adequately sample the full three-dimensional volume. Moreover, by omitting the slice-selective magnetic field gradient 412 when acquiring the inner radial readout lines 400, the latency period $d_{latency}$ can be reduced for the inner radial readout lines 400 since there is no need to wait for ramp-down of the slice gradient, application of a rephasing magnetic field gradient, or so forth.

The acquired combination of two-dimensional and three-dimensional radial readout data can be used in various ways. In one approach, the inner radial readout lines 400 are reconstructed into a low resolution three-dimensional image volume including low spatial frequency components. The outer radial readout lines 404 are reconstructed into a two-dimensional image slice including high spatial frequency components. The slice of the low resolution three-dimensional image volume corresponding to the two-dimensional image slice is extracted and combined in image space to produce a high resolution final image slice. Alternatively, the two-dimensional image portion extracted from the low resolution three-dimensional image volume can be re-projected to produce projection data that is combined with the outer radial readout lines 404, optionally with smoothing or intensity normalization based on data in the overlapping region 408, and reconstructed to produce the final image slice.

Optionally, a plurality of two dimensional slices such as the slice 502 along with additional parallel slices 502', 502" (shown in phantom in FIG. 6) are acquired. Each additional slice 502', 502" is reconstructed in the same way as the slice 502, taking advantage of the three-dimensionality of the k-space data acquired in the three-dimensional volume 500 to fill in the low frequency k-space data in the additional slices 502', 502". Combining the reconstructed images of the slices 502, 502', 502" produces a multiple-slice three-dimensional image.

Regarding the additional parallel slices 502', 502", at least two distinct variants of generating multiple-slice images are contemplated. In order to specify a dataset of k-space data, it is necessary to describe both the k-space locations of the data points, and also the spatial geometry of the excitation which was performed to generate the signal. In one variant, the additional slices 502', 502" and so forth may exhibit identical k-space locations and identical readout gradient encoding, however they may be generated from different physical slices by using different selective excitations. To reconstruct images from such data, each additional slice can be reconstructed separately as a two-dimensional image, and combined with appropriate data generated from the three dimensional k-space data 500. In the second variant, the additional slices 502', 502" and so forth may be excited with the same excitation pulse and share the same spatial geometry defined as a finite thickness slab, however they may have distinct locations in k-space. In the second variant, the slice direction in k-space can exhibit a gradient phase encoding along the slice direction, which in Cartesian phase encoded k-space geometries is often called the secondary phase encoding. For this second variant, an excited slab of a defined thickness can be subdivided into thinner slices by use of the Fourier transforms or the likes, and combined with data generated from the three dimensional k-space data 500. These and other possible slice encoding variants exhibit the very favorable feature that a moderate number of slices can be generated with better resolution or with less data acquisitions than would be needed to collect the equivalent resolution with a non-selective three dimensional technique, and yet the acquisition can be performed with readout times shorter than would be possible with typical slice-selective techniques.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging method comprising:
applying a plurality of first radio frequency excitations;
acquiring inner radial readout lines in an inner portion of k-space using a first readout magnetic field gradient profile, each first radio frequency excitation being followed by the acquiring of one of the inner radial readout lines;
applying a plurality of second radio frequency excitations;
acquiring outer radial readout lines in an outer portion of k-space disposed substantially outside of the inner portion of k-space using a second readout magnetic field gradient profile different from the first readout magnetic field gradient profile, each second radio frequency excitation being followed by the acquiring of one of the outer radial readout lines, wherein the number of outer radial readout lines is substantially larger than the number of inner radial readout lines; and
reconstructing the acquired inner and outer radial readout lines to produce a reconstructed image.

2. The magnetic resonance imaging method as set forth in claim 1, wherein the inner and outer portions of k-space overlap.

3. The magnetic resonance imaging method as set forth in claim 1, wherein (i) the first readout magnetic field gradient profile includes a readout magnetic field gradient that increases in strength with increasing time, and (ii) the second readout magnetic field gradient profile includes a readout magnetic field gradient that decreases in strength with increasing time.

4. The magnetic resonance imaging method as set forth in claim 3, wherein the readout magnetic field gradient of the first readout magnetic field gradient profile increases in strength linearly with increasing time.

5. The magnetic resonance imaging method as set forth in claim 4, wherein the readout magnetic field gradient of the first magnetic field gradient profile increases at a slew rate which is substantially equal to the maximal slew rate sustainable by the gradient system.

6. The magnetic resonance imaging method as set forth in claim 3, wherein the second magnetic field gradient profile follows a three dimensional radio frequency excitation, and the readout magnetic field gradient of the second magnetic field gradient profile decreases at a rate proportional to a time difference raised to about the ⅔ power.

7. The magnetic resonance imaging method as set forth in claim 3, wherein the second magnetic field gradient profile follows a two dimensional radio frequency excitation, and the readout magnetic field gradient of the second magnetic field gradient profile decreases at a rate proportional to a time difference raised to about the ½ power.

8. The magnetic resonance imaging method as set forth in claim 3, wherein the readout magnetic field gradient of the second magnetic field gradient profile monotonically decreases at a non-uniform rate substantially optimized with respect to a signal to noise ratio of the image.

9. The magnetic resonance imaging method as set forth in claim 1, wherein each of the first and second radio frequency excitations include a corresponding slice selective magnetic field gradient.

10. The magnetic resonance imaging method as set forth in claim 1, wherein the number of outer radial readout lines is at least five times greater than the number of inner radial readout lines.

11. The magnetic resonance imaging method as set forth in claim 1, wherein (i) the first readout magnetic field gradient profile includes a latency interval immediately following the first radio frequency excitation during which latency interval the readout magnetic field gradient strength is substantially zero, and (ii) the second readout magnetic field gradient profile includes a magnetic field gradient strength that increases following the second radio frequency excitation without a latency interval.

12. The magnetic resonance imaging method as set forth in claim 1, further including:

filtering the acquired inner and outer radial readout lines either before or during reconstruction to remove contributions from outside of a bandwidth defined by: the gradient profiles, the Larmor constant, and a spatial extent of the image.

13. A magnetic resonance imaging system for performing the magnetic resonance imaging method of claim 1.

14. A magnetic resonance imaging method comprising:

applying a plurality of first radio frequency excitations wherein the first radio frequency excitations are three-dimensional excitations;

acquiring inner radial readout lines in an inner portion of k-space using a first readout magnetic field gradient profile, each first radio frequency excitation being followed by the acquiring of one of the inner radial readout lines;

applying a plurality of second radio frequency excitations wherein the second radio frequency excitations are two-dimensional excitations;

acquiring outer radial readout lines in an outer portion of k-space disposed substantially outside of the inner portion of k-space using a second readout magnetic field gradient profile different from the first readout magnetic field gradient profile, each second radio frequency excitation being followed by the acquiring of one of the outer radial readout lines; and reconstructing the acquired inner and outer radial readout lines to produce a reconstructed image.

15. The magnetic resonance imaging method as set forth in claim 14, wherein the reconstructing of the acquired inner and outer radial readout lines to produce a reconstructed image includes:

reconstructing the inner radial readout lines to produce an intermediate three-dimensional reconstructed image;

reconstructing the outer radial readout lines to produce an intermediate two-dimensional reconstructed image slice; and combining at least a portion of the intermediate three-dimensional reconstructed image and the intermediate two-dimensional reconstructed image slice to produce a final reconstructed image.

16. The magnetic resonance imaging method as set forth in claim 14, wherein the second radio frequency excitations are two-dimensional excitations corresponding to a plurality of slices, and the reconstructing of the acquired inner and outer radial readout lines to produce a reconstructed image includes:

reconstructing the inner radial readout lines to produce an intermediate three-dimensional reconstructed image;

reconstructing the outer radial readout lines to produce a plurality of intermediate two-dimensional reconstructed image slices; and combining at least a portion of the intermediate three-dimensional reconstructed image and the intermediate two-dimensional reconstructed image slices to produce a final three-dimensional reconstructed image.

17. The magnetic resonance imaging method as set forth in claim 14, wherein the inner and outer portions of k-space overlap.

18. The magnetic resonance imaging method as set forth in claim 14, wherein (i) the first readout magnetic field gradient profile includes a readout magnetic field gradient that increases in strength with increasing time, and (ii) the second readout magnetic field gradient profile includes a readout magnetic field gradient that decreases in strength with increasing time.

19. The magnetic resonance imaging method as set forth in claim 18, wherein the readout magnetic field gradient of the first readout magnetic field gradient profile increases in strength linearly with increasing time.

20. The magnetic resonance imaging method as set forth in claim 19, wherein the readout magnetic field gradient of the first magnetic field gradient profile increases at a slew rate which is substantially equal to the maximal slew rate sustainable by the gradient system.

21. The magnetic resonance imaging method as set forth in claim 18, wherein the readout magnetic field gradient of the second magnetic field gradient profile decreases at a rate proportional to a time difference raised to about the ½ power.

22. The magnetic resonance imaging method as set forth in claim 18, wherein the readout magnetic field gradient of the second magnetic field gradient profile monotonically decreases at a non-uniform rate substantially optimized with respect to a signal to noise ratio of the image.

* * * * *